United States Patent [19]

Radice

[11] 4,392,178
[45] * Jul. 5, 1983

[54] APPARATUS FOR THE RAPID CONTINUOUS CORONA POLING OF POLYMERIC FILMS

[75] Inventor: Peter F. Radice, King of Prussia, Pa.
[73] Assignee: Pennwalt Corporation, Philadelphia, Pa.
[*] Notice: The portion of the term of this patent subsequent to Dec. 21, 1999, has been disclaimed.
[21] Appl. No.: 197,463
[22] Filed: Oct. 16, 1980
[51] Int. Cl.³ .............................................. H01F 1/02
[52] U.S. Cl. ................................... 361/233; 29/25.35
[58] Field of Search ...................... 361/233, 229, 225; 29/25.35; 307/400

[56] References Cited
U.S. PATENT DOCUMENTS

| | | | |
|---|---|---|---|
| 3,391,044 | 7/1968 | Kaghan et al. | 361/233 |
| 3,885,301 | 5/1975 | Murayama | 361/233 |
| 4,047,998 | 9/1977 | Yoshikawa et al. | 307/400 |
| 4,067,056 | 1/1978 | Taylor et al. | 361/233 |
| 4,079,437 | 3/1978 | Sheffield | 361/233 |
| 4,089,034 | 5/1978 | Taylor et al. | 361/233 |

OTHER PUBLICATIONS

"Corona Discharge Treatment Process and Apparatus", IBM Tech. Disclosure Bull., vol. 19, No. 5, Oct. 1976, p. 1644.

Primary Examiner—G. Z. Rubinson
Assistant Examiner—L. C. Schroeder

[57] ABSTRACT

Polymeric films exhibiting piezoelectric properties have such properties enhanced by being subjected to improved poling apparatus of the present invention comprising a textured corona discharge electrode roller oscillating over the polymeric film, preferably polyvinylidene fluoride, while the film is simultaneously slowly transported on a rotating drum. The electrode continuously discharges corona through the film while sweeping back and forth thereover. Comparatively low voltages are employed and dielectric breakdown of the film is substantially non-existent. A protective reuseable co-film is preferably interposed between the oscillating electrode and film to be poled.

43 Claims, 5 Drawing Figures

APPARATUS FOR THE RAPID CONTINUOUS CORONA POLING OF POLYMERIC FILMS

CROSS-REFERENCE TO RELATED PATENT APPLICATIONS

Reference is hereby made to patent application of Peter F. Radice for "Corona Discharge Polarization Process", Ser. No. 197,463, filed of even date herewith, now U.S. Pat. No. 4,365,283, and assigned to Pennwalt Corporation, assignee of the present application.

STATEMENT OF INVENTION

This invention relates to improved apparatus for rapidly enhancing the piezoelectric properties of polar polymeric films by continuous corona poling thereof, and more particularly to such apparatus wherein the film, slowly transported on a rotating drum is subjected to a multiplicity of passes from an oscillating electrode discharging corona through the film while simultaneously rolling thereover.

BACKGROUND AND SUMMARY OF INVENTION

It is known that polyvinyl fluoride, polyvinylidene fluoride, and polyvinyl chloride, for example, may be made to possess enhanced piezoelectric and pyroelectric properties through the application of a dc electric field thereto at polarizing temperatures. In general, the application of a high dc voltage to a polar polymeric or thermoplastic film material will produce a film having enhanced electric properties. Care must be exercised however that dielectric breakdown of the film does not occur.

The present invention utilizes a corona discharge electrode roller which oscillates over the film to be poled which is transported by a slowly rotating drum, resulting in any given point or line on the film being subjected to a multiplicity of corona discharge passes by the corona discharge electrode. Thus, in lieu of a single high voltage discharge required by several prior art devices with frequent concomitant dielectric breakdown, the present invention employs much lower voltages resulting in substantially non-existent dielectric breakdown.

Additionally, many prior art polymer films require electroconductive coatings to be applied to the film surfaces prior to poling thereof, thus forming a capacitor-like device capable of storing high electric energy. Oftentimes the stored energy would discharge with resultant damage to the film. Even where a single electroconductive coating only is required, the added cost of its vacuum vaporizing on the film, for example, must be considered in any large scale production process. The present invention requires no electroconductive coating on either surface of the polymer film or sheet, although such a coating on one or both sides may be used.

Further, many prior art film poling apparatuses require the presence of heat while polarizing voltages are being applied thereto. The temperatures may range between about 50° C. to slightly lower than the softening point of the film, or lower than approximately 180° C. The elevated temperatures reduce the resistance of the film material enabling lesser voltages to effect an equivalent enhanced piezoelectricity. The present invention requires no elevated temperatures while the film is subjected to the corona poling voltages.

In brief, a field intensified ionization (corona) source of voltage repeatedly traverses the moving polarizable polymer in the present invention to result in fewer breakdowns of the polymer film, when compared to prior art static corona apparatuses, while yet providing a higher degree of operational flexibility, i.e., the frequency of the oscillating corona discharge electrode can readily be varied along with the speed of rotation of the drum which guides and transports the film thereover.

DETAILED DESCRIPTION OF THE INVENTION

Figure 1:
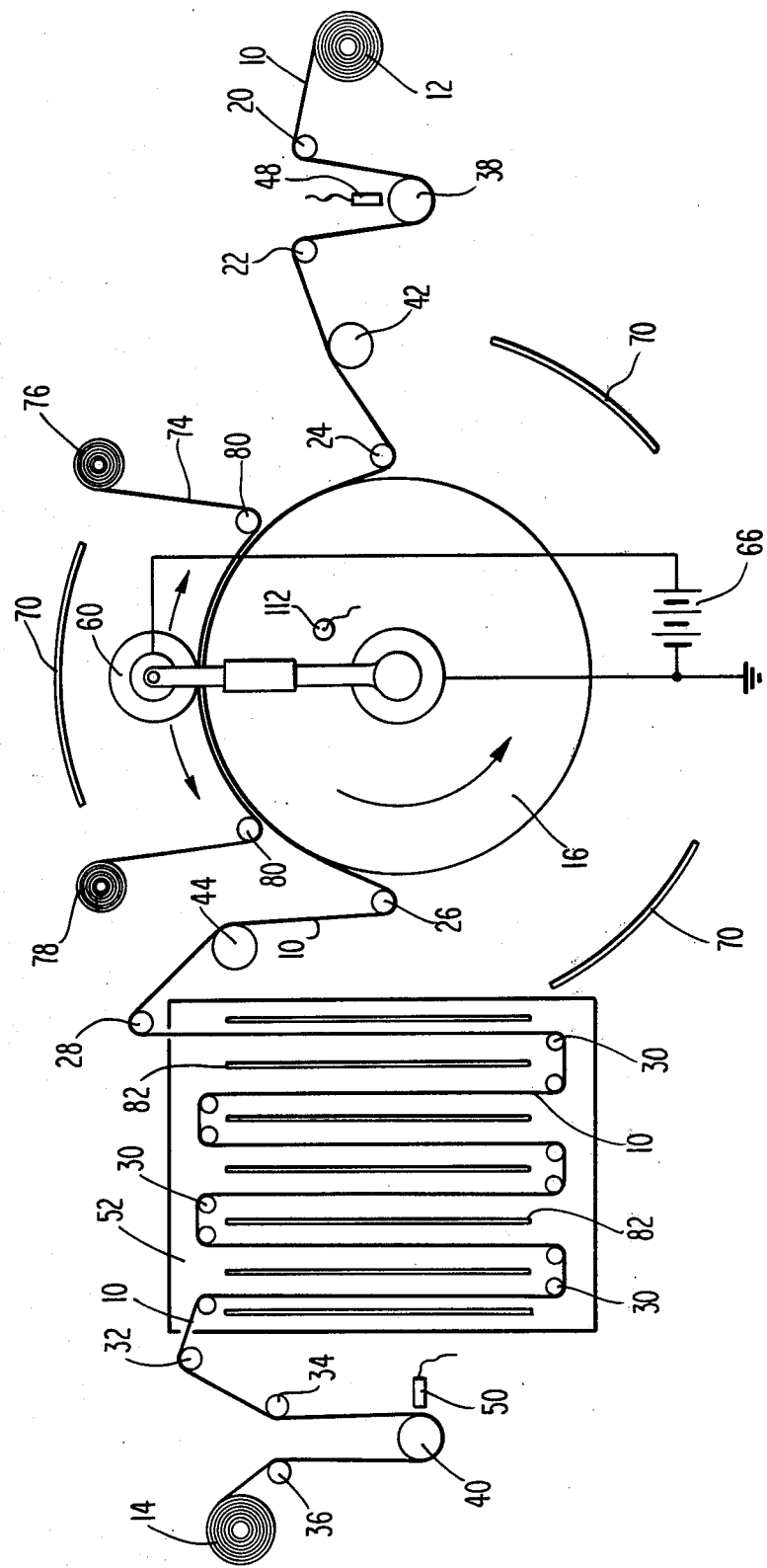
FIG. 1 is a diagrammatic representation of the poling apparatus of the present invention.

In FIG. 1, the polymeric material to be poled is illustrated as film 10, suitably KYNAR, a polyvinylidene fluoride product of Pennwalt Corp., Philadelphia, Pa., assignee of the present invention. Films of polyvinylidene fluoride (hereinafter referred to as $PVF_2$) exhibit piezoelectric properties which may be enhanced by subjecting the films to polarizing or "poling" techniques. Film 10 may be uniaxially, bi-axially, or multiaxially oriented. The invention is not limited to $PVF_2$. Other thermoplastic or polymeric materials such as polyvinylfluoride and polyvinylchloride, for example, may be used advantageously with the improved poling apparatus to be hereinafter disclosed.

Film 10 is wound around supply spool 12, and after poling of the film, is caused to be rewound on take-up spool 14. Drum 16, intermediate the spools, is rotated by a motor (not shown), suitably a stepping motor, and causes film 10 to be transported along a designated path, i.e., a path defined by conventional rollers including guide or idler rollers, 20, 22, 24, 26, 28, 30, 32, 34 and 36; dancer rollers 38 and 40; and speader rollers 42 and 44. Dancer rollers 38 and 40 may be suspended, caused to rest on a pivot arm, or otherwise suitably disposed. Dancer roller 38 will "dance" upwardly when tension on film 10 between drum 16 and supply spool 12 increases. A proximity switch 48 may be disposed adjacent dancer roller 38 for actuating a suitable motor (not shown) which will play out additional film from supply spool 12 until tension on film 10 is returned to normal. Another proximity switch 50 may be disposed in operable relationship to dancer roller 40 to control tension of film 10 between take-up spool 14 and heating chamber 52. Heating chamber 52 is later described.

Careful adjustment of the motors (not shown) controlling rotation of drum 16 and take-up spool 14 may obviate the need for the proximity switches.

Conventional spreader rollers 42 and 44 maintain film 10 in a substantially wrinkle-free condition prior and subsequent to corona discharge treatment.

Figure 2:
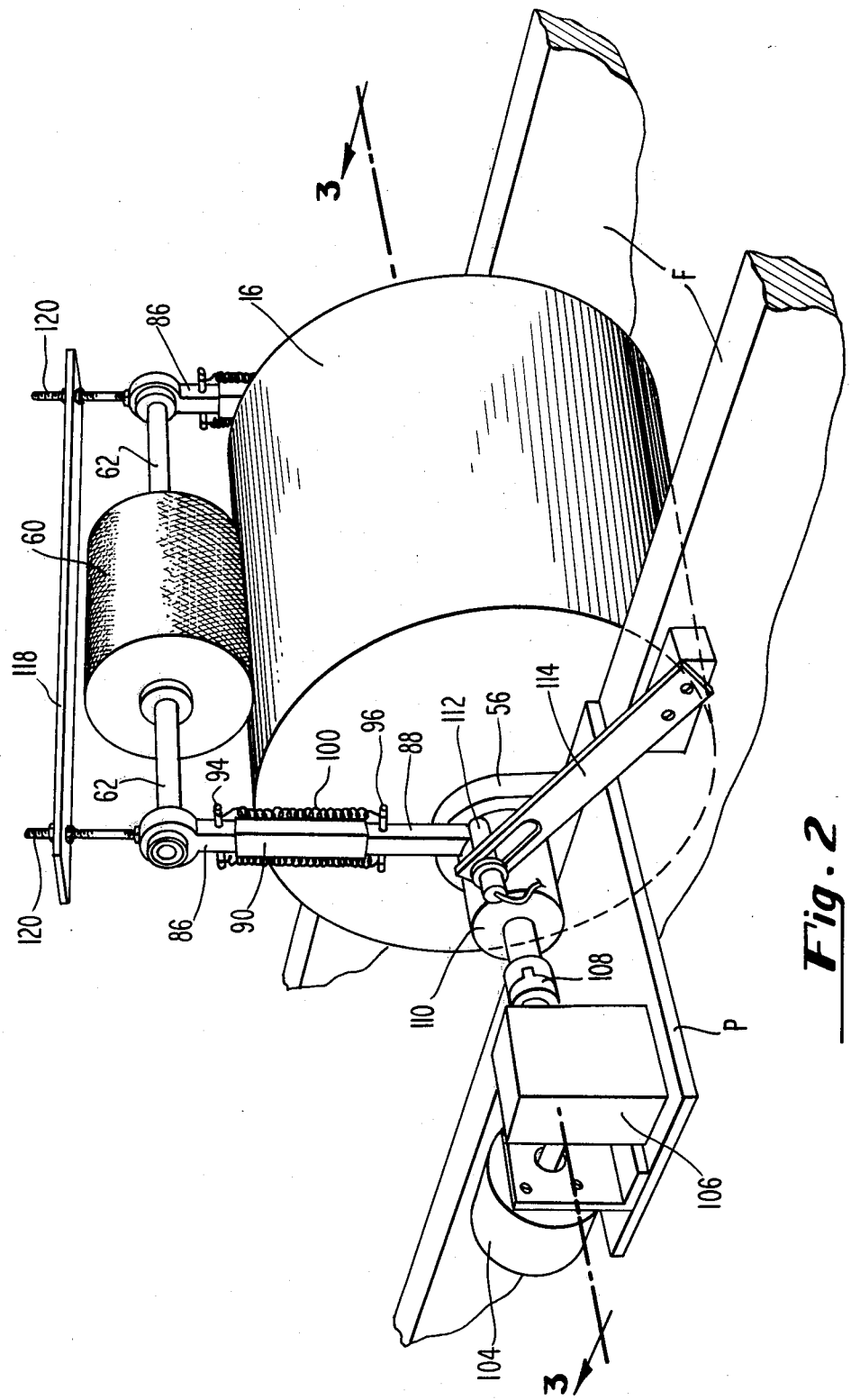
FIG. 2 is a perspective view of the corona discharge electrode and rotating drum of FIG. 1 and means for oscillating the electrode on a circumferential surface of the rotating drum.
Figure 3:
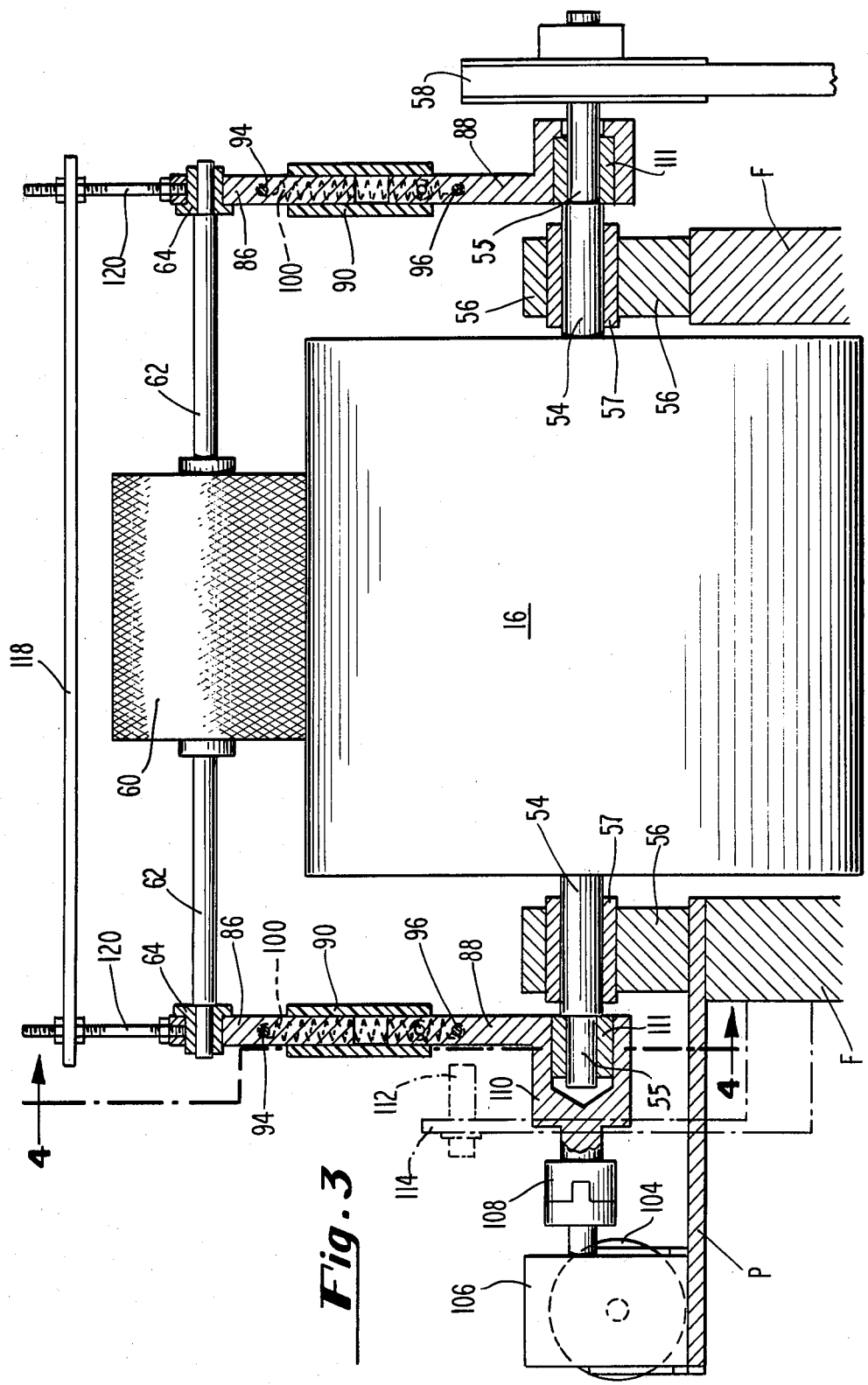
FIG. 3 is a sectional view of the apparatus of FIG. 2 taken along line 3—3 thereof.
Figure 4:
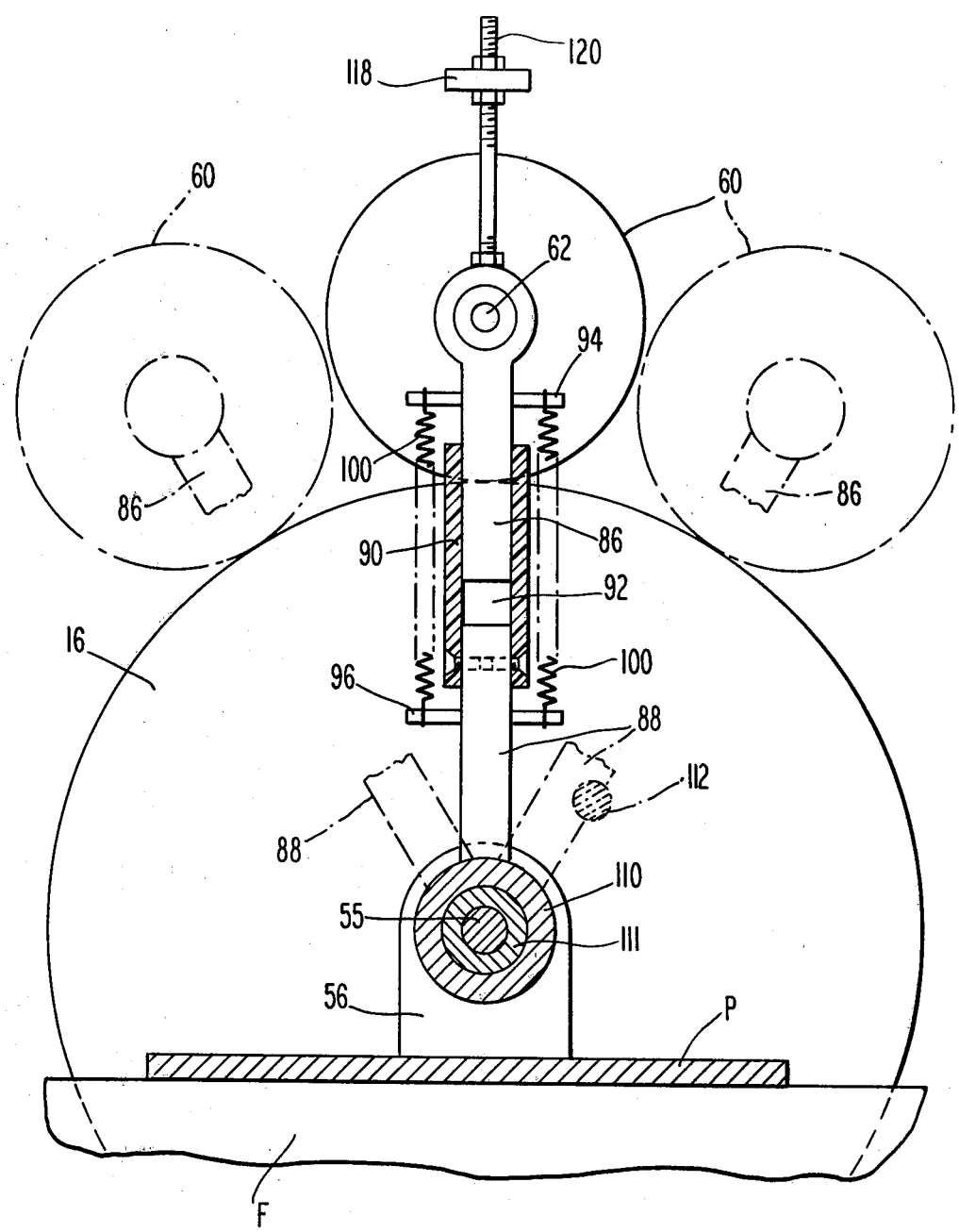
FIG. 4 is a sectional view of FIG. 3 taken along line 4—4 thereof.

Referring to FIGS. 2, 3, and 4, drum 16 is provided with an integral drum shaft 54 having an outer necked-down shaft 55. Pillow blocks 56, one on each side of drum 16, receive shaft 54 to support the drum while permitting smooth rotation of the shaft therewithin by means of bushings or bearings 57. A stepping motor, for example, (not shown) causes drum 16 to rotate through a belt 58 or conventional sprocket and chain means. Drum 16, in the embodiments illustrated, is approximately 13" in diameter.

Cooperating with rotating drum 16, in the poling of film 10 is a corona discharge electrode 60. Electrode 60 is provided with an integral shaft 62, which articulates with structure permitting the electrode to oscillate about an axis which, in the embodiments illustrated, coincides with the axis of rotation of drum 16. More specifically, as drum 16 slowly rotates on drum shaft 54 to transport film 10 on a circumferential surface of the drum, electrode 60 rolls back and forth on the slowly transported film 10 in an oscillating motion normal to the axis of rotation of the drum. Thus, those areas on moving film 10 contacted by the rolling oscillating electrode, which areas define lines of contact parallel with the axis of rotation of drum 16, are continuously subjected to a multiplicity of passes by electrode 60, each pass further enhancing the piezoelectric properties of the film. Any such given line of film is thus slowly rotated by the drum beyond the oscillating path of electrode 60 for subsequent treatment in heating chamber 52 and final winding on take-up spool 14.

The entire outer or contact surface of electrode 60 is preferably textured, such as knurled or grooved, for example, in order to provide a plurality of projection points from which, or adjacent thereto, corona will readily discharge therefrom. I have discovered that about 20 to 40 knurls per inch produce excellent results. In the embodiment illustrated, electrode 60 is approximately 4" in diameter.

A dc voltage source 66 (FIG. 1) is applied conventionally across electrode 60 and drum 16, the latter being led to ground.

Flexible radiant heaters 70 are provided about drum 16 and electrode 60 if heat is desired thereat.

In order to preserve the physical integrity of film 10 during poling thereof, a protective film or co-film 74 (FIG. 1) is preferably interposed between film 10 and electrode 60 such that the knurled electrode 60 rolls on the co-film which is transported at a substantially identical speed with film 10. Co-film 74 may be wound on co-film supply spool 76 and rewound on co-film take-up spool 78, the latter being powered by a constant torque or slip drive motor, for example. Alternatively, the reuseable co-film 74 may be made seamless and transported over film 10 as an endless belt. Guide or idler rollers 80 define the path of the co-film.

Co-film 74 is suitably a copolymer of monomers vinylidene fluoride and tetrafluoroethylene in a ratio of about 70-30 weight % respectively.

Heating chamber 52 includes a plurality of thermostatically controlled radiant panels 82 of any suitable design. Heating chamber 52, diagrammatically illustrated in FIG. 1, is approximately 5' high and 4' wide.

Referring again to FIGS. 2, 3, and 4, electrode shaft 62 is mounted for oscillating rolling movement along the circumference of drum 16 in a direction normal to drum shaft 54. Substantially identical structure is disposed on each side of drum 16 which permits such oscillating rolling movement.

Electrode shaft 62 is mounted for rotation in bushings 64 secured within upper drive arms 86 which communicate with lower drive arms 88 by means of an electrically insulating housing suitably comprised of insulating strip members 90 clamped therearound. Upper drive arms 86 and lower drive arms 88 are metallic and electrically conductive. As shown clearly in FIG. 4, upper drive arms 86 and lower drive arms 88 are separated by an air gap 92, preferably at least ½". Air gaps 92 prevents short circuiting of electrode 60 and drum 16 when a dc voltage from source 66 is applied thereacross.

Non-conducting pins 94 and 96 extend laterally from the upper and lower drive arms respectively to engage a pair of tension springs 100 therebetween which insure electrode 60, when oscillating, will be in contact with co-film 74, or film 10 if no co-film is used, while the film is being transported on rotating drum 16. However, when the modified electrode of FIG. 5 is used, later described, the textured surface of electrode 60 is not in direct contact with either co-film 74 or film 10.

Oscillating motion of electrode 60 is effected by an instantaneously reversible synchronous dc stepping motor 104 acting through a suitable gear reducer 106 which, through coupling means 108, causes drive arm hub 110 to free-wheel on necked-down shaft 55 through bushing 111, the lower arm 88 being connected to hub 110 or integral therewith. Necked-down shaft 55 partially supports hub 110 and the drive arm mechanism. A proximity switch 112, adjustably mounted on adjustable arm 114, causes motor 104 to change its direction of rotation when lower drive arm 88 comes sufficiently close to the proximity switch, which reverses the direction of travel of electrode 60. Step motor 104 continues to rotate in the direction dictated by proximity switch 112 for a pre-adjusted number of steps before automatically reversing itself to again approach switch 112. Adjustable arm 114 is adjustably mounted to and supported on framework F. A horizontal plate P, secured atop framework F, supports motor 104 and rear reducer 106.

A bar 118 is connected between threaded rods 102, one rod extending outwardly from each upper drive arm 86 to help stabilize the oscillating movement of electrode 60 as well as maintain substantially constant pressure of electrode 60 along the entire line of contact with co-film 74, or film 10. Bar 118 is movably adjustable along rods 120 to accommodate electrodes of varying diameters.

Figure 5:
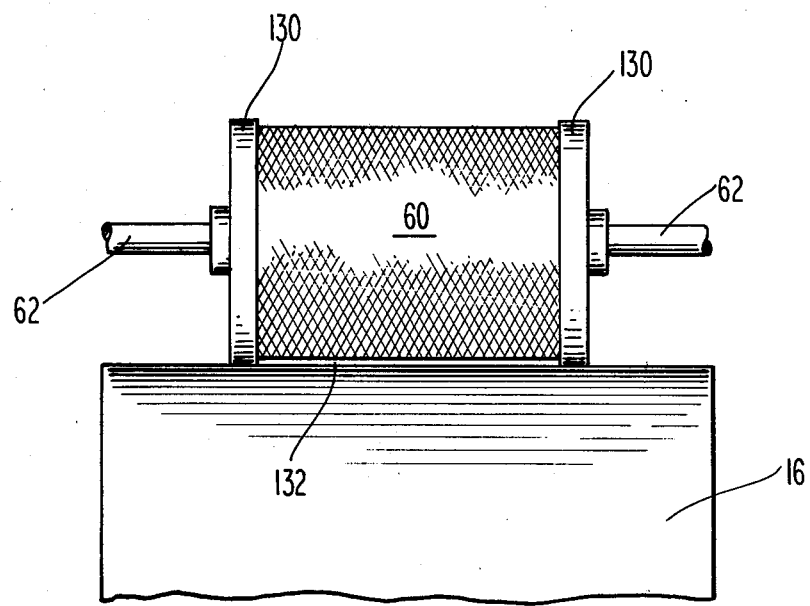
FIG. 5 illustrates a modification of the electrode of FIG. 3.

Referring now to FIG. 5, each end of electrode 60 is provided with a rim 130 of dielectric material, thus providing a space or gap 132 between the textured surface of electrode 60 and drum 16. Selected portions of the apparatus may be enclosed in order that gap 132 may comprise a suitable unreactive gas, such as nitrogen, for example, or a partial vacuum or reduced pressure environment.

The following examples are illustrative of the present invention:

EXAMPLE I

PVF$_2$ film, 28 microns thick and approximately 8" wide, is threaded through the disclosed poling apparatus, as well as 30' of co-film of six mil thickness, all as illustrated in FIG. 1 of the drawings. The voltage applied to the oscillating corona discharge electrode roller was 11,500 volts, and the roller swept over a given line of the film approximately 70 times while both films were being transported at a rate of 0.6' per min. Heating chamber 52 was maintained at 75° C. and film 10 required 15 minutes in passing therethrough. The co-film, of course, is rewound on spool 78. The activity of film 10 was determined to be 15 pC/N after stabilizing under pressure as disclosed in U.S. Pat. No. 4,055,878 for "Stabilization of Piezoelectric Resin Elements" of Peter F. Radice, i.e., short circuiting of the two surfaces of the piezoelectric film while high pressure is applied to the film for a sufficient period of time, with or without the application of external heat, to thereby produce a film or element having a true piezoelectricity, i.e., one which demonstrates a stable piezoelectric constant with time.

EXAMPLE II

Same as Example I except that the corona discharge electrode roller was heated to 43° C., and the voltage applied thereto was 8500 volts, which electrode swept a given line of film 48 times while both films were transported at a rate of 1.0′ per minute. Activity of the poled film was 22 pC/N.

In the present invention, the frequency of oscillations of electrode 60 can be varied as well as the speed of rotation of drum 16, to thereby provide operational flexibility of the apparatus with respect to the amount of corona discharge applied to the film. Added flexibility of the apparatus is provided by the fact that no electroconductive coatings are required on the film, thus permitting a wide spectrum of conductive coating configurations to be applied to the film surfaces after poling. Poled film has limited utility until at least one surface thereof is metallized. Thus, intricate electrode patterns may now be applied to either or both film surfaces to satisfy needs of customers.

Heating chamber 52 is preferably maintained between about 55° to 80° C. Temperatures in excess of about 80° C. reduce the activity of the film. Conversely, temperatures below about 65° C. result in a film having sub-optimum activity.

The pizeoelectric films produced herein are also pyroelectric. Pyroelectric films find usage in pyroelectric transducers, IR detectors, heat detectors, and the like.

I claim

1. Apparatus for continuously enhancing piezoelectric properties of polymeric film exhibiting such properties comprising
    a rotating drum contacting said film for transport thereof along a defined path,
    a corona discharge electrode roller mounted for movement along circumference of said drum in an oscillating motion normal to axis of rotation of said rotating drum, said film having at least one area in constant contact with said rotating drum and oscillating electrode, and
    means for providing continuous corona discharge from said electrode through said film substantially at said contact area for poling said film.
2. The apparatus of claim 1 further characterized by a heating chamber disposed downstream of said electrode roller, and
    other means for urging said poled film through said heating chamber.
3. The apparatus of claim 2 wherein said electrode roller is provided with a textured surface.
4. The apparatus of claim 2 wherein said electrode roller is provided with a knurled surface.
5. The apparatus of claim 2 wherein said electrode roller is provided with a grooved surface.
6. The apparatus of claim 3 wherein said oscillating motion of said electrode is characterized by a rolling thereof over said film.
7. The apparatus of claim 6 wherein said rotating drum contacts said film for transport thereof over a portion of circumference of said drum.
8. The apparatus of claim 7 wherein said film is provided with an electroconductive coating on one or both sides thereof.
9. The apparatus of claim 7 further characterized by a co-film disposed between said electrode roller and polymeric film in direct contact therewith and,
    means for transporting said co-film with said polymeric film at substantially identical speeds.
10. The apparatus of claim 9 wherein said polymeric film comprises polyvinylidene fluoride.
11. The apparatus of claim 9 wherein said co-film comprises co-polymerized vinylidene fluoride and tetrafluoroethylene in a ratio of about 70-30 weight percent respectively.
12. The apparatus for continuously enhancing piezoelectric properties of polymeric film exhibiting such properties comprising
    a rotating drum having a portion of its circumferential surface touching said film for continuously transporting and guiding said film along a defined path,
    electrode means oscillating on said film and in direct contact therewith, said oscillations being characterized by a rolling movement between two spaced lines parallel with axis of rotation of said drum on said circumferential surface such that given lines parallel with and between said spaced lines are swept a multiplicity of passes by said oscillating electrode means prior to said given lines being transported downstream of said two spaced lines, and
    means for providing continuous corona discharges from said electrode means through said film for poling said film.
13. The apparatus of claim 12 wherein said electrode means is provided with a surface which is textured, knurled or grooved.
14. The apparatus of claim 13 wherein a co-film is disposed between said electrode means and said polymeric film and in direct contact therewith, and
    means for transporting said co-film with said polymeric film at substantially identical speeds.
15. The apparatus of claim 14 further characterized by
    a heating chamber downstream of said electrode means, and
    motorized means for urging said poled film through said heating chamber.
16. The apparatus of claim 14 further characterized by said polymeric film being devoid of metallic coatings on either surface thereof.
17. The apparatus of claim 14 wherein said poled film subsequent to treatment in said heating chamber possesses pyroelectric properties.
18. The apparatus of claim 14 wherein means are provided for controlling the speed of rotation of said drum and frequency of oscillations of said electrode means.
19. The apparatus of claim 14 further characterized by the axis of rotation of said drum and oscillating movement of said electrode means being substantially coincident.

20. The apparatus of claim 15 wherein heating means are disposed adjacent said rotating drum and electrode means to provide external heat thereto.

21. Apparatus for continuously enhancing piezoelectric properties of polymeric film exhibiting such properties comprising a rotating drum contacting said film for transport thereof along a defined path, a corona discharge electrode roller mounted for movement along circumference of said drum in an oscillating motion, and means for providing continuous corona discharge from said electrode through said film for poling said film.

22. Apparatus for continuously enhancing piezoelectric properties of polymeric film exhibiting such properties comprising a rotating drum contacting said film for transport thereof along a defined path, a corona discharge electrode roller having a textured surface mounted for movement along circumference of said drum in an oscillating motion, means for spacing said textured surface from said film, and other means for providing continuous corona discharge from said textured surface through said film for poling said film.

23. The apparatus of claim 22 wherein said means comprises a dielectric rim provided at each end of said electrode roller, and said film has at least one area in constant contact with said rotating drum.

24. The apparatus of claim 23 further characterized by a heating chamber disposed downstream of said electrode roller, and additional means for urging said poled film through said heating chamber.

25. The apparatus of claim 23 wherein said textured surface of said electrode roller is a knurled surface.

26. The apparatus of claim 23 wherein said textured surface of said electrode is a grooved surface.

27. The apparatus of claim 23 wherein said oscillating motion of said electrode is characterized by a rolling thereof over said film.

28. The apparatus of claim 23 wherein said rotating drum contacts said film for transport thereof over a portion of circumference of said drum.

29. The apparatus of claim 28 wherein said film is provided with an electroconductive coating on one or both sides thereof.

30. The apparatus of claim 28 further characterized by a co-film disposed between said electrode roller and polymeric film in direct contact therewith and, means for transporting said co-film with said polymeric film at substantially identical speeds.

31. The apparatus of claim 30 wherein said polymeric film comprises polyvinylidene fluoride.

32. The apparatus of claim 30 wherein said co-film comprises co-polymerized vinylidene fluoride and tetrafluoroethylene in a ratio of about 70–30 weight percent respectively.

33. Apparatus for continuously enhancing piezoelectric properties of polymeric film exhibiting such properties comprising a rotating drum having a portion of its circumferential surface touching said film for continuously transporting and guiding said film along a defined path, a corona discharge electrode roller having a dielectric rim provided at each end thereof and a textured surface on said electrode therebetween, said electrode oscillating on said film by means of said rims being in direct contact with said film and said textured surface being spaced therefrom, said oscillations being characterized by a rolling movement between two spaced lines parallel with axis of rotation of said drum on said circumferential surface such that given lines parallel with and between said spaced lines are swept a multiplicity of passes by said oscillating electrode roller prior to said given lines being transported downstream of said two spaced lines, and means for providing continuous corona discharges from said textured surface of said electrode roller through said film for poling thereof.

34. The apparatus of claim 33 wherein said textured surface of said electrode roller is a knurled surface.

35. The apparatus of claim 33 wherein said textured surface of said electrode roller is a grooved surface.

36. The apparatus of claim 33 wherein a co-film is disposed between said electrode roller and said polymeric film, and means for transporting said co-film with said polymeric film at substantially identical speeds.

37. The apparatus of claim 36 further characterized by a heating chamber downstream of said electrode roller, and motorized means for urging said poled film through said heating chamber.

38. The apparatus of claim 36 further characterized by said polymeric film being devoid of metallic coatings on either surface thereof.

39. The apparatus of claim 36 further characterized by said polymeric film having an electroconductive metallic coating on one or both sides thereof.

40. The apparatus of claim 36 wherein said poled film subsequent to treatment in said heating chamber possesses pyroelectric properties.

41. The apparatus of claim 36 wherein means are provided for controlling the speed of rotation of said drum and frequency of oscillations of said electrode roller.

42. The apparatus of claim 36 further characterized by the axis of rotation of said drum and oscillating movement of said electrode roller being substantially coincident.

43. The apparatus of claims 33 or 36 wherein heating means are disposed adjacent said rotating drum and electrode roller to provide external heat thereto.

* * * * *